United States Patent
Kang

(10) Patent No.: US 10,916,325 B2
(45) Date of Patent: Feb. 9, 2021

(54) MEMORY CHIP AND TEST SYSTEM INCLUDING THE SAME

(71) Applicant: SK hynix Inc., Icheon (KR)

(72) Inventor: Jae Seok Kang, Seoul (KR)

(73) Assignee: SK hynix Inc., Icheon (KR)

( * ) Notice: Subject to any disclaimer, the term of this patent is extended or adjusted under 35 U.S.C. 154(b) by 180 days.

(21) Appl. No.: 16/167,258

(22) Filed: Oct. 22, 2018

(65) Prior Publication Data

US 2019/0279734 A1  Sep. 12, 2019

(30) Foreign Application Priority Data

Mar. 8, 2018 (KR) .................. 10-2018-0027521

(51) Int. Cl.
| | |
|---|---|
| *G11C 29/00* | (2006.01) |
| *G11C 29/44* | (2006.01) |
| *G11C 29/56* | (2006.01) |
| *G11C 8/12* | (2006.01) |
| *G11C 13/00* | (2006.01) |
| *G11C 29/52* | (2006.01) |

(52) U.S. Cl.
CPC .............. *G11C 29/44* (2013.01); *G11C 8/12* (2013.01); *G11C 13/004* (2013.01); *G11C 29/52* (2013.01); *G11C 29/56008* (2013.01); *G11C 29/70* (2013.01); *G11C 2013/0054* (2013.01); *G11C 2029/5602* (2013.01)

(58) Field of Classification Search
CPC ... G11C 29/44; G11C 29/52; G11C 29/56008; G11C 29/70; G11C 8/12; G11C 13/004; G11C 2013/0054; G11C 2029/5602
USPC ....... 714/719, 710, 711, 704, 718, 723, 745, 714/819, 824, 6.2, 6.32
See application file for complete search history.

(56) References Cited

U.S. PATENT DOCUMENTS

| | | | | |
|---|---|---|---|---|
| 2008/0052015 | A1* | 2/2008 | Ozawa | G01R 31/31932 702/57 |
| 2008/0201621 | A1* | 8/2008 | Sato | G11C 29/56 714/718 |
| 2012/0117432 | A1* | 5/2012 | Fujisaki | G11C 29/56008 714/719 |
| 2013/0301369 | A1* | 11/2013 | Shvydun | G11C 29/72 365/200 |

FOREIGN PATENT DOCUMENTS

| | | |
|---|---|---|
| KR | 10-0911252 B1 | 8/2009 |
| KR | 10-2016-0143014 A | 12/2016 |

* cited by examiner

*Primary Examiner* — Christine T. Tu

(57) ABSTRACT

A memory chip includes a memory region group including a plurality of memory regions. The memory chip also includes a peripheral unit configured to generate region flags of the memory regions by performing write and read operations on the respective memory regions, each of the region flags indicating whether corresponding memory region is a defective region, and to generate a group flag indicating whether the memory region group needs to be repaired, based on the region flags.

19 Claims, 11 Drawing Sheets

US 10,916,325 B2

MEMORY CHIP AND TEST SYSTEM INCLUDING THE SAME

CROSS-REFERENCES TO RELATED APPLICATION

The present application claims priority under 35 U.S.C. § 119(a) to Korean application number 10-2018-0027521, filed on Mar. 8, 2018, in the Korean Intellectual Property Office, which is incorporated herein by reference in its entirety.

BACKGROUND

1. Technical Field

Various embodiments generally relate to a memory chip, and more particularly, to a memory chip capable of performing a test operation.

2. Related Art

A memory system may be configured to store data provided from a host device, in response to a write request of the host device. Furthermore, the memory system may be configured to provide data stored therein to the host device, in response to a read request of the host device.

The memory system may include a memory chip. The memory chip may include a defective memory region, and the defective memory region may be repaired with a spare normal memory region. In the memory chip, the spare memory region for repair may be limited. Therefore, when the spare memory region of the memory chip is efficiently used, the yield of the memory chip can be increased at the fabrication step.

SUMMARY

In an embodiment, a memory chip may include: a memory region group including a plurality of memory regions; and a peripheral unit configured to generate region flags of the memory regions by performing write and read operations on the respective memory regions, each of the region flags indicating whether a corresponding memory region is a defective region, and generate a group flag based on the region flags, the group flag indicating whether the memory region group needs to be repaired.

In an embodiment, a memory chip may include: a plurality of memory region groups each comprising a plurality of memory regions, the memory region groups including a plurality of memory region sets, each memory region set being grouped with the memory regions that are configured to be accessible at the same time; and a peripheral unit is configured to generate set flags of the memory region sets by performing write and read operations on the memory region sets, each of the set flags indicating whether the corresponding memory region set is a defective set, and generate a multi-group flag indicating whether the memory region groups need to be repaired based on the set flags.

In an embodiment, a test system may include: a memory chip including: a memory region group including a plurality of memory regions; a peripheral unit configured to generate region flags of the memory regions by performing write and read operations on the memory regions, each of the region flags indicating whether the corresponding memory region is a defective region, and generate a group flag based on the region flags; and a test device configured to control the memory chip, and repair the memory region group according to the group flag.

In an embodiment, a test system may include: a memory chip including: a plurality of memory region groups each including a plurality of memory regions, wherein memory regions which are accessible at the same time in the memory region groups are grouped as a memory region set, such that the memory region groups include a plurality of memory region sets; and a peripheral unit configured to generate set flags of the memory region sets by performing write and read operations on the memory region sets, each of the set flags indicating whether the corresponding memory region set is a defective set, and generate a multi-group flag indicating whether the memory region groups need to be repaired based on the set flags; and a test device configured to control the memory chip, and repair the memory region groups according to the multi-group flag.

DETAILED DESCRIPTION

Figure 1:
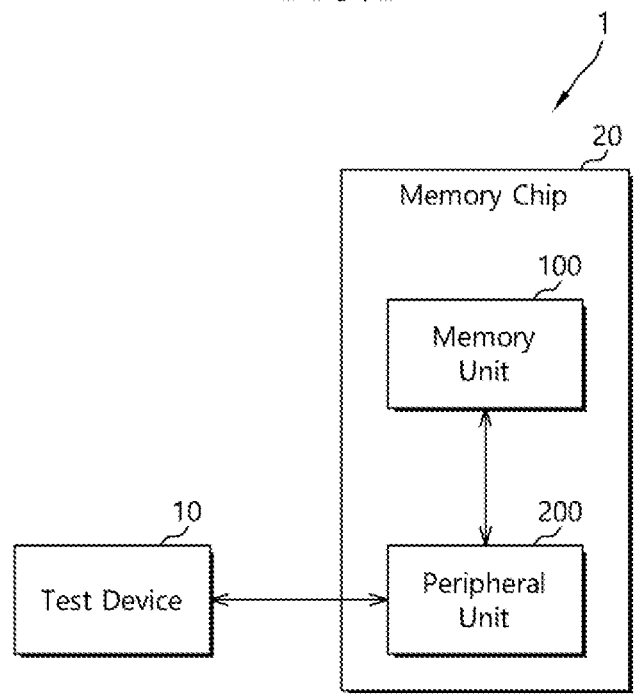
FIG. 1 is a block diagram schematically illustrating a test system including a memory chip in accordance with an embodiment.

Hereinafter, a data storage device and an operating method thereof according to the present invention will be described with reference to the accompanying drawings through exemplary embodiments of the present invention.

The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram schematically illustrating a test system 1 including a memory chip 20 in accordance with an embodiment.

Referring to FIG. 1, the test system 1 may include a test device 10 and a memory chip 20.

The test device 10 may perform a test operation on a memory unit 100 of the memory chip 20 by controlling a peripheral unit 200 of the memory chip 20. The test device 10 may perform a test operation to repair a defective region of the memory unit 100. Specifically, the test device 10 may perform a test operation and receive a flag from the peripheral unit 200, the flag corresponding to a region where the test operation has been performed. Then, the test device 10 may repair the corresponding region according to the flag. The flag may indicate whether the region where the test operation has been performed needs to be repaired.

As described in detail below, the test device 10 may perform a test operation on a predetermined memory region group basis. The peripheral unit 200 may generate a group flag by performing a test operation on a memory region group according to control of the test device 10, the group flag indicating whether the memory region group needs to be repaired, and transfer the group flag to the test device 10.

In an embodiment, the test device 10 may perform test operations on a plurality of memory region groups at the same time. The peripheral unit 200 may generate a multi-group flag by performing test operations on the plurality of memory region groups at the same time according to control of the test device 10, the multi-group flag indicating whether the memory region groups need to be repaired, and transfer the multi-group flag to the test device 10. That is, the test system in accordance with the present embodiment can expand the unit of test and thus reduce the test time and power.

The memory chip 20 may include the memory unit 100 and the peripheral unit 200.

The memory unit 100 may include a plurality of memory cells capable of storing data therein. The detailed configuration of the memory unit 100 will be described with reference to FIG. 2.

The peripheral unit 200 may generate a flag by performing a test operation on one or more memory region groups of the memory unit 100 according to control of the test device 10, and transfer the flag to the test device 10. Embodiments of the peripheral unit 200 will be described in detail with reference to FIGS. 3 and 8.

The memory chip 20 may include a chip at the wafer level or package level, for example. That is, the test device 10 can perform a test operation on the memory chip 20 at the wafer level or package level.

The memory chip 20 may include a volatile memory chip or a nonvolatile memory chip, or both. For example, the memory chip 20 may include a volatile memory chip such as a Dynamic Random Access Memory (DRAM), a Static Random Access Memory (SRAM), and the like. For example, the memory chip 20 may include a nonvolatile memory chip such as a flash memory (such as a NAND flash or a NOR flash), a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

FIG. 1 illustrates that the test system 1 includes one memory chip 20. However, the test system 1 in accordance with the present embodiment may include a plurality of memory chips. In this case, the test device 10 can perform test operations on a plurality of memory chips at the same time in parallel.

Figure 2:
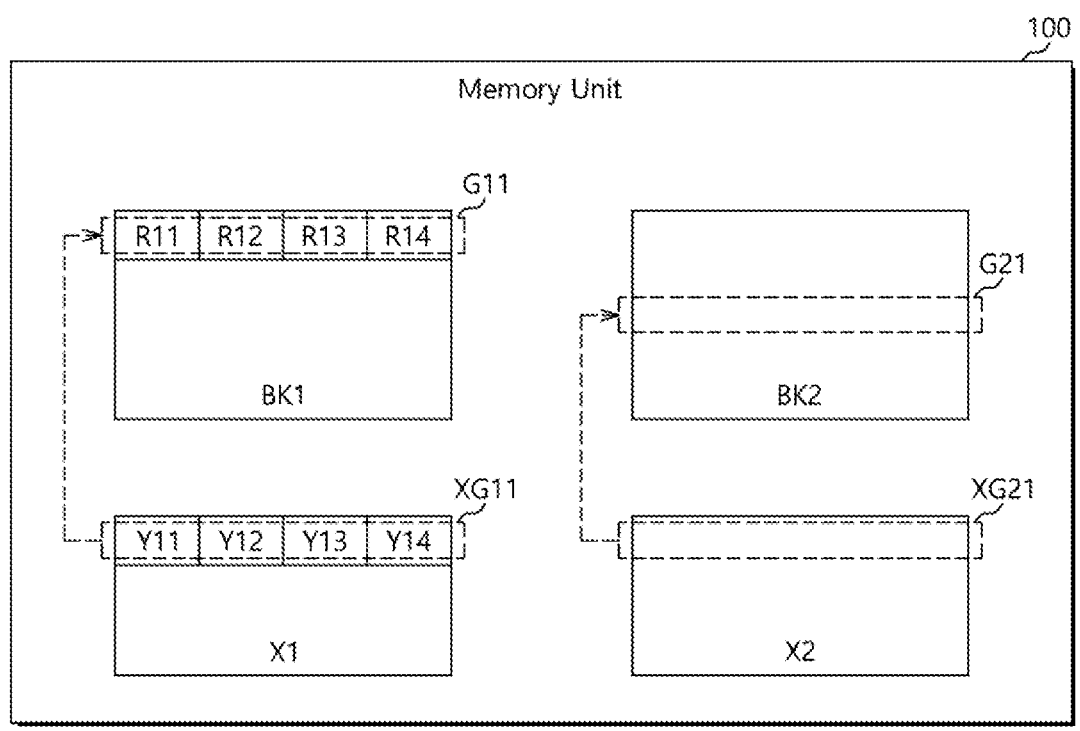
FIG. 2 is a block diagram illustrating the configuration of a memory unit of FIG. 1 in accordance with the present embodiment.

FIG. 2 is a block diagram illustrating the configuration of the memory unit 100 of FIG. 1 in accordance with the present embodiment.

The memory unit 100 may include a first memory bank BK1, a first repair region X1, a second memory bank BK2 and a second repair region X2. The memory unit 100 illustrates two memory banks BK1 and BK2 and two repair regions X1 and X2. In an embodiment, however, the memory chip 20 may include three or more memory banks and three or more repair regions respectively corresponding to the memory banks.

The first memory bank BK1 may include a plurality of memory regions. FIG. 2 illustrates memory regions R11, R12, R13, and R14 among the plurality of memory regions included in the first memory bank BK1. The memory region may correspond to the unit for a read operation of the memory chip 20. That is, data stored in each of the memory regions may be read together by one read command transferred from outside, for example, from the test device of FIG. 1 or another controller. Each of the memory regions may include a plurality of memory cells (not illustrated) which are read-accessed together according to the read command. The unit of the memory region may be specified according to the type of the memory chip 20 or the physical connection structure of the memory cells.

The plurality of memory regions R11 to R14 included in the first memory bank BK1 may be grouped into a memory region group on a repair basis, and the first memory bank BK1 may include a plurality of memory region groups. For example, the memory regions R11 to R14 may constitute one repair unit, and be grouped as a memory region group G11.

When it is determined that a predetermined portion of the first memory bank BK1 includes an "unallowable" defect (or unacceptable defect), the repair unit may indicate a unit for replacing the defective portion with a normal portion (that is, a portion not considered defective) of the first repair region X1. For example, the memory region group G11 may be replaced with a repair memory region group XG11 corresponding to the same repair unit in the first repair region X1, according to the result of the test operation of the test device 10. The repair memory region group XG11 may have the same size as the memory region group G11. That is, when an external controller instructs the memory chip 20 to access a memory region in the memory region group G11, the memory chip 20 may instead access the corresponding repair memory region in the repair memory region group XG11.

The memory regions R11 to R14 grouped as the memory region group G11 may be coupled to the same line; that is, the memory regions R11 to R14 may all be coupled to a same selection signal (e.g., a same word line) in the memory bank BK1.

The memory regions R11 to R14 grouped as the memory region group G11 may correspond to the same row address or column address.

The memory region group G11 may include some defective regions and some normal regions. In the present embodiment, depending on the number of defective regions, the memory region group G11 may be considered as a normal region group, and not repaired. That is, when the number of defective regions in the memory region group G11 corresponds to a correctable number of defective regions, the memory region group G11 may be considered as a normal region group, in consideration of an internal or external error correction function of the memory chip 20. In this case, the memory region group G11 may be used as it is, and not replaced with the repair memory region group XG11.

Thus, the repair memory region group XG11 may be utilized more efficiently. For example, the repair memory region group XG11 may replace another memory region group having more defects than the memory region group G11. This means that the first repair region X1 with a limited capacity can be efficiently used. Because the memory chip 20 may be discarded if the number of defective memory region group exceeds the number of repair memory region groups, embodiments may increase manufacturing yield by reducing the number of discards of the memory chip 20.

The first repair region X1 may include a plurality of repair memory regions. FIG. 2 illustrates memory regions Y11, Y12, Y13, and Y14 among a plurality of repair memory regions included in the first repair region X1. The first repair region X1 may be used to repair a defective memory region group in the first memory bank BK1.

Similar to the first memory bank BK1, the plurality of repair memory regions included in the first repair region X1 may be grouped into repair memory region groups on a repair basis, and the first repair region X1 may include a plurality of repair memory region groups. For example, the repair memory regions Y11 to Y14 may be grouped as a repair memory region group XG11, constituting a repair unit.

The second memory bank BK2 may include a plurality of memory regions. Because the second memory bank BK2 has substantially the same structure as the first memory bank BK1, the detailed descriptions thereof are omitted herein.

The second repair region X2 may include a plurality of repair memory regions. The second repair region X2 may have substantially the same structure as the first repair region X1. Similar to the above-described first repair region X1, the second repair region X2 may be used to repair a defective memory region group in the second memory bank BK2. For example, a repair memory region group XG21 of the second memory bank BK2 may be used to repair a defective memory region group G21 in the second memory bank BK2.

Figure 3:
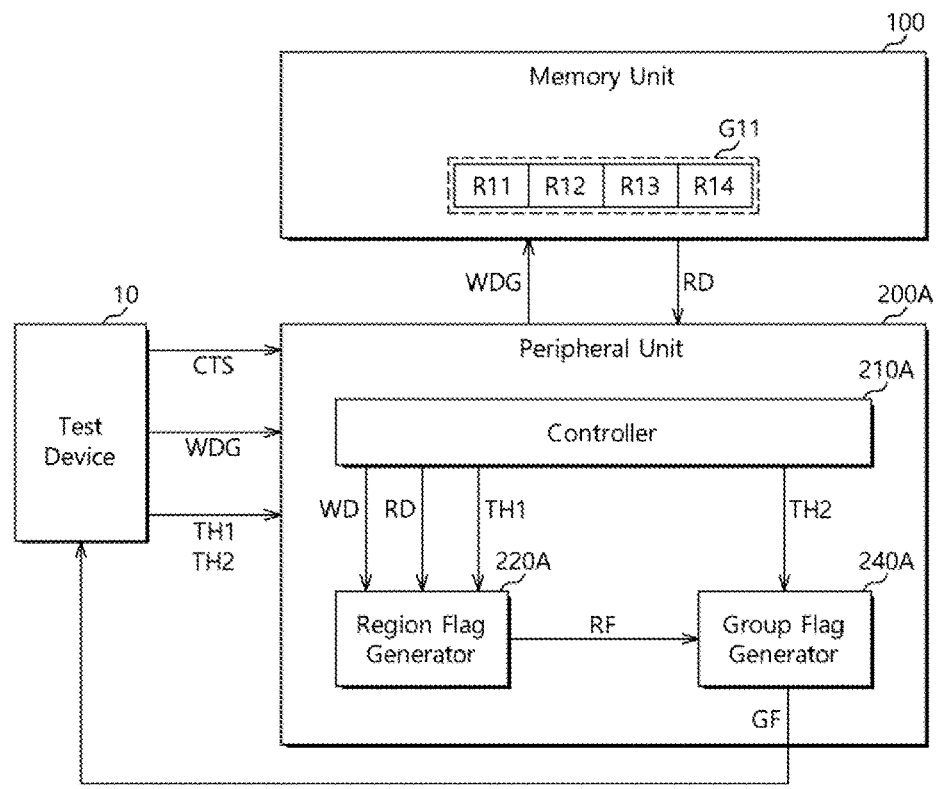
FIG. 3 is a detailed block diagram illustrating a peripheral unit in accordance with the present embodiment.

FIG. 3 is a detailed block diagram illustrating the peripheral unit 200A in accordance with the present embodiment. The peripheral unit may correspond to an embodiment of the peripheral unit 200 of FIG. 1. FIG. 3 also illustrates the memory unit 100 of FIG. 1, the memory region group G11 of the memory unit 100 and the test device 10, in order to describe the operation of the peripheral unit 200A.

Referring to FIG. 3, the peripheral unit 200A may perform a test operation on the memory region group G11 of the memory unit 100 according to control of the test device 10. Specifically, when performing a test operation according to control of the test device 10, the peripheral unit 200A may generate region flags RF of the respective memory regions R11 to R14 of the memory region group G11. Based on the region flags of the memory regions R11 to R14, the peripheral unit 200A may generate a group flag GF of the memory region group G11, and transfer the group flag GF to the test device 10.

The peripheral unit 200A may include a controller 210A, a region flag generator 220A and a group flag generator 240A. The controller 210A, the region flag generator 220A and the group flag generator 240A may be implemented in hardware, software or a combination thereof.

The controller 210A may control overall operations of the memory chip 20 according to control of the test device 10. The controller 210A may receive a control signal CTS from the test device 10, and operate based on the control signal CTS.

The control signal CTS may include a test signal indicating the start of a test operation on the memory region group G11, for example.

The control signal CTS may include a write signal to instruct the controller 210A to write a write data chunk group WDG to the memory region group G11, for the test operation. The controller 210A may receive the write data chunk group WDG with the write signal from the test device 10.

The write data chunk group WDG may include data corresponding to the size of the memory region group G11. The write data chunk group WDG may include write data chunks which are to be written to the respective memory regions R11 to R14. That is, the write data chunk may correspond to the unit of the memory region.

The control signal CTS may include a read command to instruct the controller 210A to read one or more read data chunks RD from the respective memory regions R11 to R14, for the test operation. The read data chunk RD may correspond to the unit of the memory region.

The control signal CTS may include the addresses of the memory regions R11 to R14 such that the control unit 210A can access the memory regions R11 to R14.

In an embodiment, the control signal CTS may include various signals capable of controlling operations of the controller 210A described in the present embodiment.

The controller 210A may receive a first reference number TH1 and a second reference number TH2 from the test device 10. The first reference number TH1 may be transferred to the region flag generator 220A such that the region flag generator 220A can determine the region flags RF of the respective memory regions R11 to R14 by referring to the first reference number TH1. The second reference number TH2 may be transferred to the group flag generator 240A such that the group flag generator 240A can determine the group flag GF of the memory region group G11 by referring to the second reference number TH2. The first reference number TH1 may be equal to or different from the second reference number TH2.

When a test operation is performed according to control of the test device 10, the controller 210A may be operated as follows. First, the controller 210A may write the write data chunk group WDG to the memory region group G11 according to control of the test device 10. Depending on the structure of the memory unit 100, the controller 210A may perform write operations on the memory regions R11 to R14 at the same time or sequentially.

The controller 210A may read the read data chunks RD from the memory regions R11 to R14 and transfer the read data chunks RD to the region flag generator 220A, according to control of the test device 10. That is, because the region flag RF is generated on a memory region basis, the controller 210A may read the read data chunk RD by performing the read operation on a memory region basis. As a result, the controller 210A can sequentially read the read data chunks from the memory regions R11 to R14, and sequentially transfer the read data chunks to the region flag generator 220A.

At this time, the controller 210A may transfer the write data chunks WD which have been written to the respective memory regions to the region flag generator 220A with the read data chunks RD read from the corresponding memory regions.

The controller 210A may control the region flag generator 220A to generate the region flags RF of the memory regions R11 to R14, and control the group flag generator 240A to generate the group flag GF of the memory region group G11.

The region flag generator 220A may generate the region flags RF of the respective memory regions R11 to R14 based on the write data chunks WD, the read data chunks RD and the first reference number TH1 which are transferred from the controller 210A, and transfer the region flags RF to the group flag generator 240A. Each of the region flags RF may indicate whether the corresponding memory region is a defective region. For example, a region flag RF may be generated as a first value, for example, "0", when the corresponding memory region is a normal region, or generated as a second value, for example, "1", when the corresponding memory region is a defective region. As a result, the region flag generator 220A may sequentially generate the region flags of the memory regions R11 to R14, and transfer the region flags to the group flag generator 240A.

The group flag generator 240A may generate the group flag GF of the memory region group G11 based on the region flags RF of the memory regions R11 to R14, transferred from the region flag generator 220A, and the second reference number TH2 transferred from the controller 210A, and output the group flag GF to the test device 10. The group flag GF may indicate whether the memory region group G11 needs to be repaired. For example, the group flag GF may be generated as the first value, for example, "0", when the memory region group G11 does not need to be repaired, or generated as the second value, for example, "1", when the memory region group G11 needs to be repaired.

Figure 4:
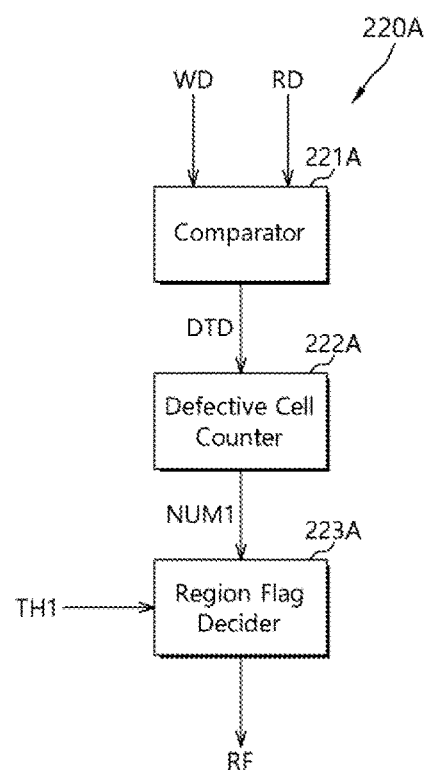
FIG. 4 is a detailed block diagram illustrating a region flag generator of FIG. 3 in accordance with the present embodiment.

FIG. 4 is a detailed block diagram illustrating the region flag generator 220A of FIG. 3 in accordance with the present embodiment.

Referring to FIG. 4, the region flag generator 220A may receive the write data chunks WD and the read data chunks RD of the respective memory regions of the memory region group G11 in FIG. 3 from the controller 210A, and generate the region flags RF of the corresponding memory regions. As described above, the region flag RF may indicate whether the corresponding memory region is a defective region or normal region.

A defective region may be determined according to the number of defective cells included in the corresponding memory region. A memory cell may be determined to be a defective cell when a bit read from the corresponding memory cell is different from a bit which has been written to the memory cell. In the present embodiment, the defective region may indicate a memory region including a larger number of defective cells than an allowable number of defective cells, in consideration of the error correction function of the memory chip. Therefore, although a memory region includes one or more defective cells, the memory region may not be determined to be a defective region, but may be determined to be a normal region, when the number of defective cells can be allowed in consideration of the error correction function.

The region flag generator 220A may include a comparator 221A, a defective cell counter 222A and a region flag decider 223A.

The comparator 221A may receive the write data chunk WD and the read data chunk RD of each of the memory regions, and output determination data DTD. The comparator 221A may compare the write data chunk WD and the read data chunk RD, and generate the determination data DTD indicating whether the write data chunk WD and the read data chunk RD coincide with each other. The determination data DTD may include information on defective cells included in each of the memory regions.

Figure 5:
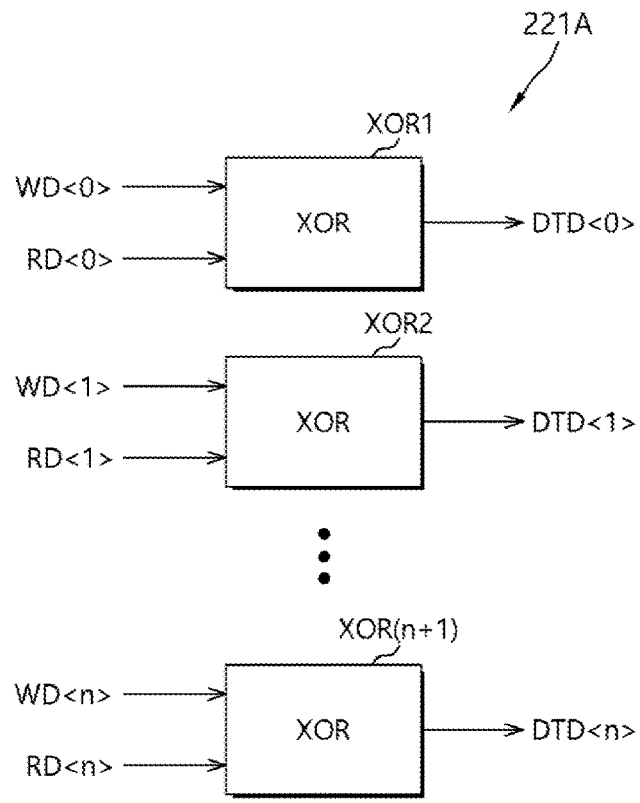
FIG. 5 is a block diagram illustrating the configuration of a comparator of FIG. 4 in accordance with the present embodiment.

FIG. 5 is a block diagram illustrating the configuration of the comparator 221A of FIG. 4 in accordance with the present embodiment.

Referring to FIG. 5, the comparator 221A may include a plurality of operation units XOR1, XOR2, . . . , XOR(n+1), where n+1 is equal to a number of bits in a write data chunk or read data chunk.

The operation units XOR1 to XOR(n+1) may respectively generate the determination data DTD by performing an exclusive-OR (XOR) operation on respective bits of the write data chunk WD and the read data chunk RD. Each of the operation units XOR1 to XOR(n+1) may receive the corresponding write bit of the write data chunk WD and the corresponding read bit of the read data chunk RD, for the corresponding memory cell, perform an XOR operation on the write bit and the read bit, and output the corresponding determination bit of the determination data DTD. For example, the operation unit XOR1 may receive a first write bit WD<0> of the write data chunk WD and a first read bit RD<0> of the read data chunk RD, perform an XOR operation on the first write bit WD<0> and the first read bit RD<0>, and output a first determination bit DTD<0> of the determination data DTD.

Therefore, when the write bit and the corresponding read bit of each memory cell coincide with each other (that is, the corresponding memory cell is a normal cell) the corresponding determination bit may be generated as the first value, for example, "0". On the other hand, when the write bit and the corresponding read bit of each memory cell are different from each other (that is, the corresponding memory cell is a defective cell) the corresponding determination bit may be generated as the second value, for example, "1".

Referring back to FIG. 4, the defective cell counter 222A may receive the determination data DTD of each of the memory regions from the comparator 221A, and output a defective cell number NUM1 of the corresponding memory region. In an embodiment, the defective cell counter 222A may count the second values of the determination data DTD, i.e. "1's", and output the count result as the defective cell number NUM1.

The region flag decider 223A may receive the defective cell numbers NUM1 of the respective memory regions from the defective cell counter 222A, and output the region flags RF of the respective memory regions. The region flag decider 223A may determine the region flags RF by comparing the defective cell numbers NUM1 to the first reference number TH1 transferred from the controller 210A. As described above, the first reference number TH1 may indicate the number of defective cells which can be allowed in each of the memory regions.

Therefore, when the defective cell number NUM of each memory region is equal to or less than the first reference number TH1, the memory region is considered a normal region and the region flag decider 223A may generate the region flag RF as the first value of "0". On the other hand, when the defective cell number NUM1 of each memory region exceeds the first reference number TH1, the memory region is considered a defective region and the region flag decider 223A may generate the region flag RF as the second value of "1".

In an embodiment, the first reference number TH1 may be stored in a memory element included in the region flag decider 223A after the test operation is started, and the stored value of the first reference number TH1 compared to the defective cell number NUM1 of each memory region whenever the defective cell number NUM1 is inputted to the region flag decider 223A.

Figure 6:
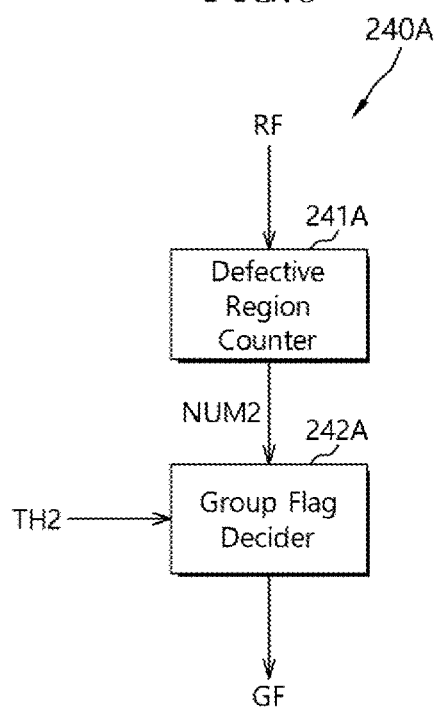
FIG. 6 is a detailed block diagram illustrating a group flag generator of FIG. 3 in accordance with the present embodiment.

FIG. 6 is a block diagram illustrating the group flag generator 240A of FIG. 3 in accordance with the present embodiment.

Referring to FIG. 6, the group flag generator 240A may receive the region flags RF of the respective memory regions R11 to R14 included in the memory region group G11 of FIG. 3, and output the group flag GF of the memory region group G11. As described above, the group flag GF may indicate whether the memory region group G11 needs to be repaired.

The group flag GF may be determined according to the number of defective regions included in the memory region group G11. The group flag generator 240A may determine whether the memory region group G11 includes a larger number of defective regions than an allowable number in consideration of the error correction function of the memory chip, based on the region flags RF of the respective regions included in the memory region group G11, and output the group flag GF of the memory region group G11 according to the determination result. Although the memory region group G11 includes one or more defective regions, the memory region group G11 may be determined to be a normal region group in the case where the number of defective regions is allowable.

The group flag generator 240A may include a defective region counter 241A and a group flag decider 242A.

The defective region counter 241A may receive the region flags RF of the respective memory regions of the memory region group G11, and output a defective region number NUM2 of the memory region group G11. The defective region number NUM2 may indicate the number of defective regions among the memory regions R11 to R14 of the memory region group G11.

The defective region counter 241A may sequentially receive the region flags of the memory regions R11 to R14 of the memory region group G11. Before receiving the first region flag of the memory regions R11 to R14, the defective region counter 241A may reset the count to zero. The defective region counter 241A may increase the count when each of the received region flags RF has the second value of "1", and not increase the count when each of the received region flags RF has the first value of "0". The defective region counter 241A may receive the region flag RF of the last memory region R14 of the memory region group G11, perform counting depending on the region flag RF, and output the count result as the defective region number NUM2.

In an embodiment, the defective region counter 241A may receive a timing signal (not illustrated) from the controller 210A whenever the region flag RF of each memory region is received. The defective region counter 214A may determine whether the received region flag RF has the second value, in response to the timing signal, and perform counting according to the determination result.

The group flag decider 242A may receive the defective region number NUM2 of the memory region group G11 from the defective region counter 241A, and output the group flag GF of the memory region group G11. The group flag decider 242A may determine the group flag GF by comparing the defective region number NUM2 to the second reference number TH2 transferred from the controller 210A. As described above, the second reference number TH2 may indicate the number of defective regions which can be allowed in the memory region group G11.

Therefore, when the defective region number NUM2 of the memory region group G11 is equal to or less than the second reference number TH2, the group flag decider 242A may determine that the memory region group G11 is a normal group. The normal region group may indicate a memory region group which does not need to be repaired. In this case, the group flag decider 242A may generate the group flag GF as the first value, for example, "0".

On the other hand, when the defective region number NUM2 of the memory region group G11 exceeds the second reference number TH2, the group flag decider 242A may determine that the memory region group G11 is a defective region group. The defective region group may indicate a memory region group which needs to be repaired. In this case, the group flag decider 242A may generate the group flag GF as the second value, for example, "1".

In an embodiment, the second reference number TH2 may be stored in a memory element included in the group flag decider 242A after the test operation is started, and the stored second reference number TH2 compared to the defective region number NUM2 of each memory region group whenever the defective region number NUM2 is inputted to the group flag decider 242A.

FIGS. 7A to 7E illustrate a process by which the peripheral unit 200A of FIG. 1 performs a test operation on the memory region group G11 according to an embodiment. The peripheral unit 200A (e.g., see FIG. 3) may generate the group flag GF of the memory region group G11 by sequentially performing steps S11 to S15 according to control of the test device 10 of FIG. 1. Hereafter, the process for performing a test operation will be described in detail with reference to FIGS. 1 to 7E.

Figure 7A:
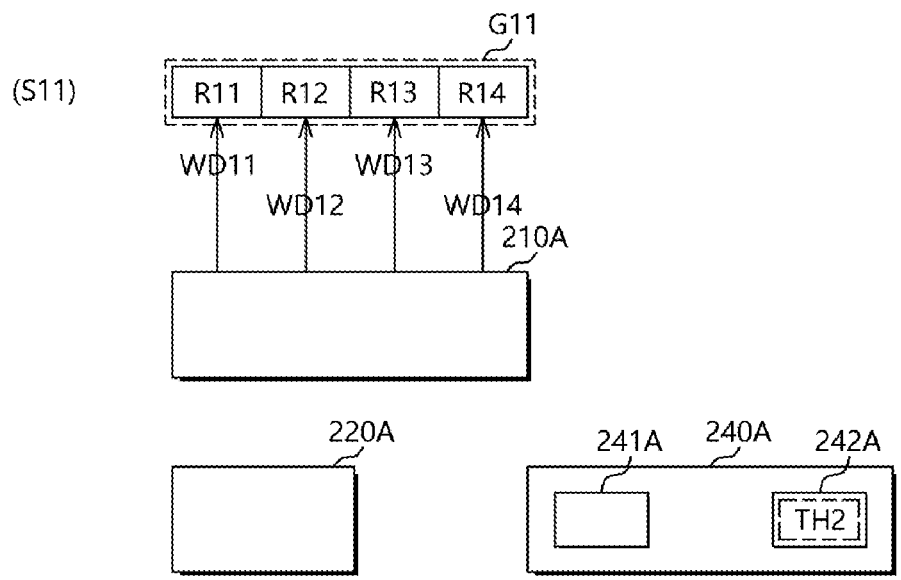
FIGS. 7A, 7B, 7C, 7D, and 7E illustrate respective steps of a process by which the peripheral unit of FIG. 1 performs a test operation on a memory region group in accordance with the present embodiment.

Referring to FIG. 7A, the controller 210A may write the write data chunks WD11 to WD14 to the respective memory regions R11 to R14 at step S11. In an embodiment, the controller 210A may not write the write data chunks WD11 to WD14 to the memory regions R11 to R14 at the same time, but writes the write data chunks corresponding to the respective memory regions before reading the read data chunks from the respective memory regions at steps S12 to S15. In an embodiment, at step S11 a count of the defective region counter 241A of the group flag generator 240A is reset.

Figure 7B:
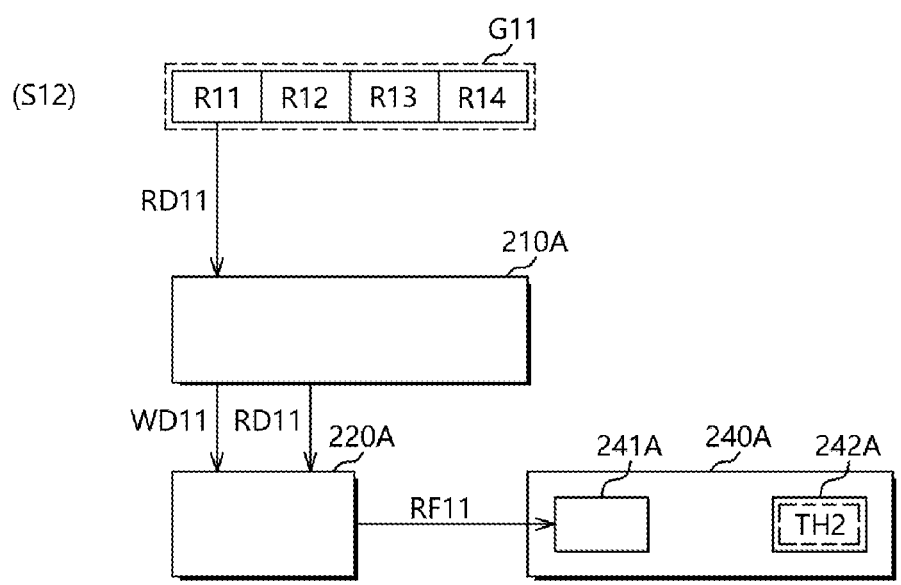

Referring to FIG. 7B, the controller 210A may read the read data chunk RD11 from the memory region R11 at step S12. The controller 210A may transfer the write data chunk WD11 written to the memory region R11 and the read data chunk RD11 to the region flag generator 220A.

The region flag generator 220A may generate the region flag RF11 of the memory region R11 based on the write data chunk WD11 and the read data chunk RD11, and transfer the region flag RF11 to the group flag generator 240A.

The defective region counter 241A of the group flag generator 240A may increase the count when the memory region R11 is determined to be a defective region according to the region flag RF11 of the memory region R11.

Figure 7C:
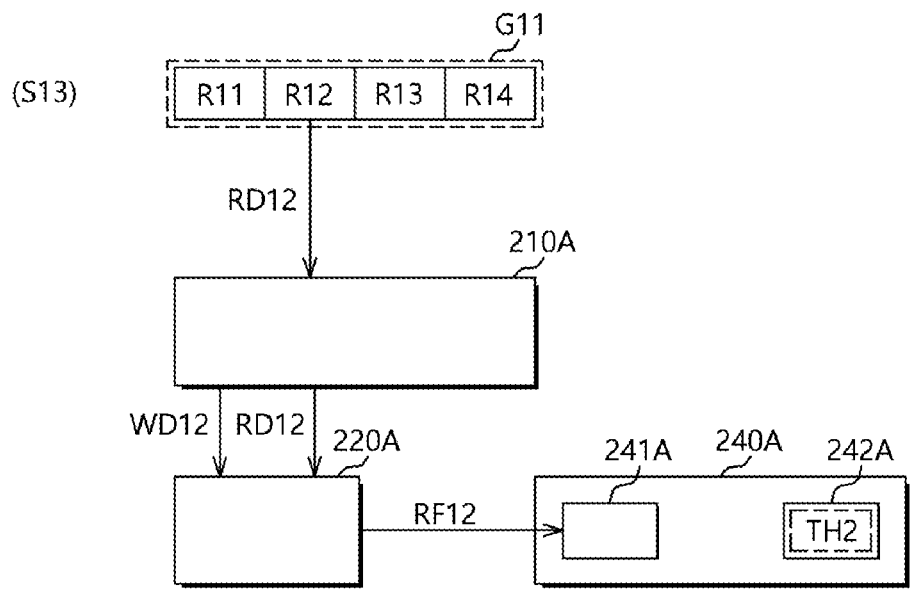
Figure 7D:
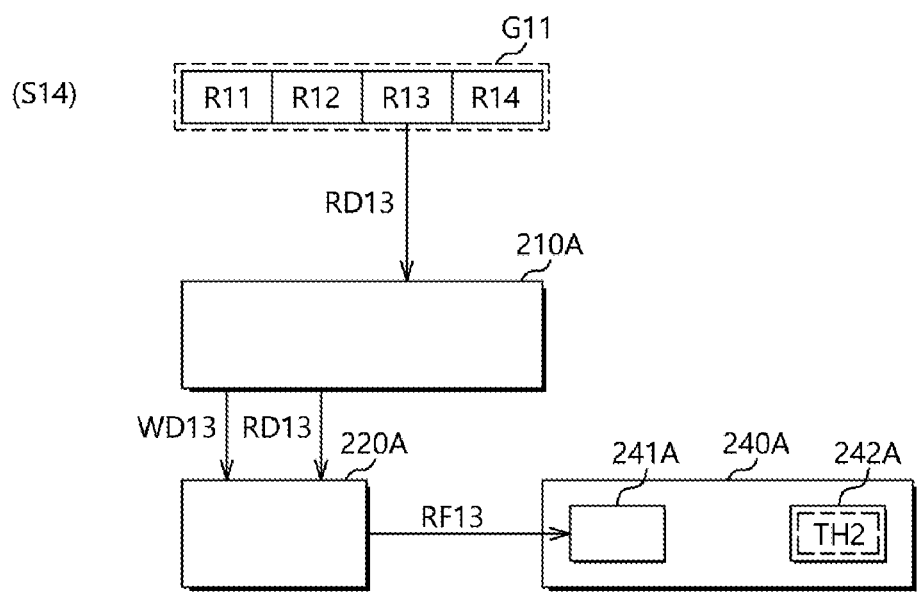
Figure 7E:
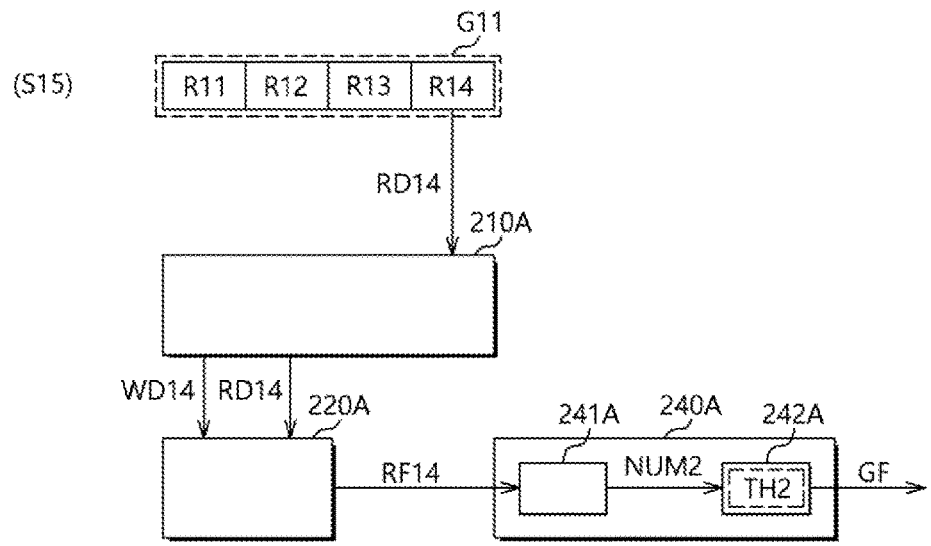

Referring to FIGS. 7C to 7E, the controller 210A and the region flag generator 220a may sequentially generate the region flags RF12 to RF14 of the memory regions R12 to R14 in a similar manner to the generating of the region flag RF11 of the memory region R11 at step S11, and transfer the region flags RF12 to RF14 to the defective region counter 241A, at steps S13 to S15. The defective region counter 241A may increase the count whenever each of the memory regions R12 to R14 is determined to be a defective region according to the region flags RF12 to RF14.

At step S15 of FIG. 7E, the defective region counter 241A may output the final count result, i.e. the defective region number NUM2 to the group flag decider 242A. The group flag decider 242A may determine the group flag GF of the memory region group G11 by comparing the defective region number NUM2 to the second reference number TH2. The group flag GF may be transferred to the test device 10.

Figure 8:
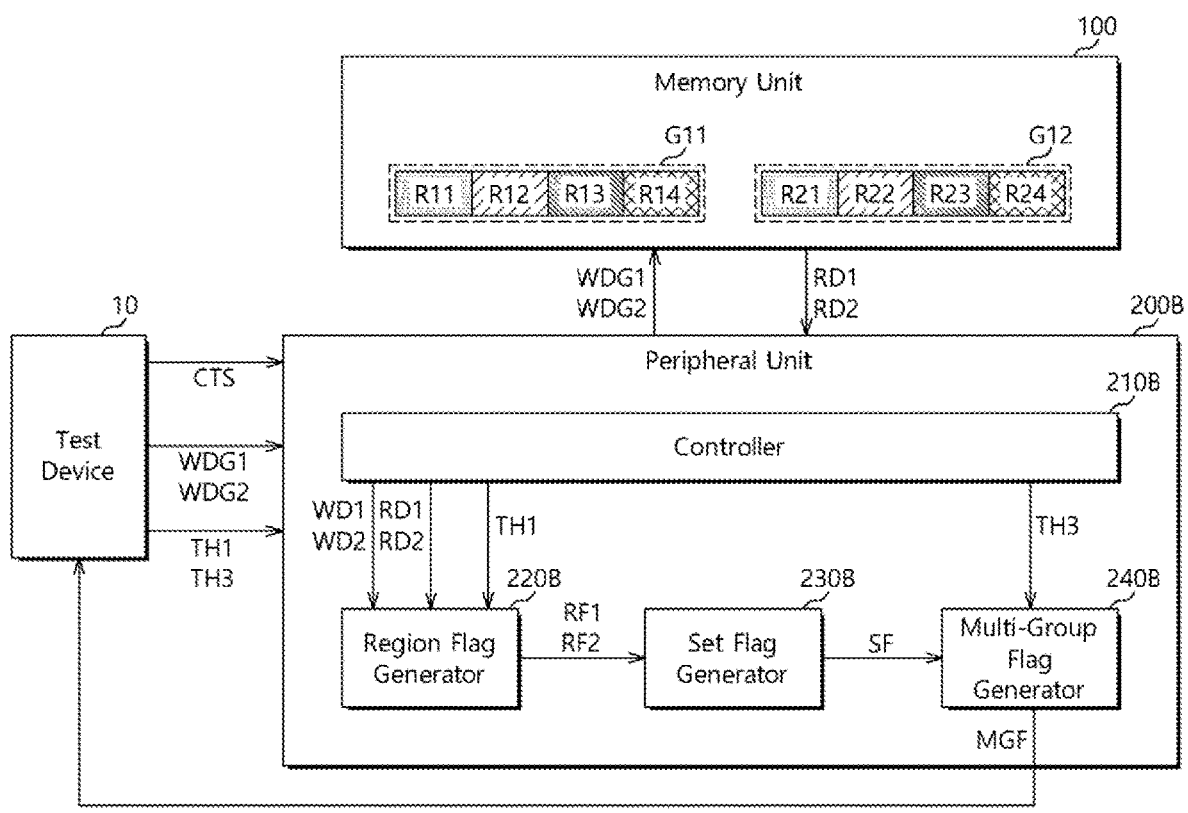
FIG. 8 is a block diagram illustrating a peripheral unit in accordance with an embodiment.

FIG. 8 is a detailed block diagram illustrating a peripheral unit 200B in accordance with an embodiment. The peripheral unit 200B may correspond to an embodiment of the peripheral unit 200 of FIG. 1. FIG. 8 also illustrates the memory unit 100 and the test device 10 of FIG. 1, in order to describe the operation of the peripheral unit 200B.

Referring to FIG. 8, the peripheral unit 200B may perform test operations on memory region groups G11 and G12 at the same time according to control of the test device 10, compared to the peripheral unit 200A of FIG. 3. The peripheral unit 200B may generate a multi-group flag MGF of the memory region groups G11 and G12, and transfer the multi-group flag MGF to the test device 10. Thus, the performance time of the test operation can be shortened. The memory region groups G11 and G12 may be included in the memory banks BK1 and BK2, respectively.

FIG. 8 illustrates the multi-group flag MGF for the memory region groups G11 and G12 of the two memory banks BK1 and BK2. However, the present embodiment can be applied in the same manner to memory region groups of three or more memory banks.

The peripheral unit 200B may include a controller 210B, a region flag generator 220B, a set flag generator 230B and a multi-group flag generator 240B. The controller 210B, the region flag generator 220B, the set flag generator 230B and the multi-group flag generator 240B may be implemented in hardware, software or a combination thereof.

Like the controller 210A of FIG. 3, the controller 210B may write write data chunk groups WDG1 and WDG2 transferred from the test device 10 to the memory region groups G11 and G12, respectively, according to control of the test device 10. Each of the write data chunk groups WDG1 and WDG2 may include write data chunks which are to be written to memory regions of the corresponding memory region group.

The controller 210B may perform a read operation on a memory region set basis in the memory region groups G11 and G12, according to control of the test device 10. That is, the controller 210B can read-access memory regions constituting each memory region set at the same time. Each memory region set may include memory regions which can be accessed at the same time from each of the memory region groups G11 and G12.

For example, the memory region set may include memory regions located at the same positions in the memory region groups G11 and G12. For example, the first memory regions R11 and R21 of the memory region groups G11 and G12 may constitute a single memory region set S1. In this way, the memory regions R11, R12, R13, and R14 and R21, R22, R23, and R24 of the memory region groups G11 and G12 may respectively constitute the memory region sets S1, S2, S3, and S4 as illustrated in FIG. 8.

The controller 210B may read read data chunks RD1 and RD2 from the memory region sets S1 to S4, and transfer the read data chunks RD1 to RD2 to the region flag generator 220B. That is, the controller 210B may read the read data chunks RD1 and RD2 by performing a read operation on a memory region set basis. As a result, the controller 210B may sequentially read the read data chunks RD1 and RD2 from each the memory region sets S1 to S4 in sequence, and transfer the read data chunks RD1 to RD2 to the region flag generator 220B.

At this time, the controller 210B may transfer the write data chunks WD1 and WD2 which have been written to the respective memory region sets to the region flag generator 220B with the read data chunks RD1 and RD2 read from the corresponding memory region sets.

The controller 200B may control the region flag generator 220B, the set flag generator 230B and the multi-group flag generator 240B to operate as follows.

The region flag generator 220B may generate region flags RF1 and RF2 of the memory regions constituting each of the memory region sets, based on the write data chunks WD1 and WD2, the read data chunks RD1 and RD2, and the first reference number TH1 transferred from the controller 2108, and transfer the region flags RF1 and RF2 to the set flag generator 230B. Each of the region flags RF1 and RF2 may indicate whether the corresponding memory region is a defective region. For example, a region flag may be generated as the first value of "0", when the corresponding memory region is a normal region, or generated as the second value of "1", when the corresponding memory region is a defective region. As a result, the region flag generator 220B may sequentially generate the region flag pairs of the memory region sets S1 to S4, and transfer the region flag pairs to the set flag generator 230B.

The set flag generator 230B may generate set flags SF of the respective memory region sets based on the region flag pairs RF1 and RF2 of the respective memory region sets, transferred from the region flag generator 220B, and transfer the set flags SF to the multi-group flag generator 240B. The set flag SF may indicate whether one or more of the memory regions constituting each of the memory region sets are defective regions. For example, the set flag SF may be generated as the first value of "0" when the memory regions constituting each of the memory region sets are all normal regions. On the other hand, the set flag SF may be generated as the second value of "1" when at least one of the memory regions constituting each of the memory region sets is a defective region. As a result, the set flag generator 230B may sequentially generate the set flags of the memory region sets S1 to S4, and transfer the set flags to the multi-group flag generator 240B.

The multi-group flag generator 240B may generate the multi-group flag MGF of the memory region groups G11 and G12 based on the set flags SF of the memory region sets S1 to S4, transferred from the set flag generator 230B, and a third reference number TH3 transferred from the controller 210B, and output the multi-group flag MGF to the test device 10.

The multi-group flag MGF may indicate whether the memory region groups G11 and G12 need to be repaired. For example, the multi-group flag MGF may be generated as the first value of "0" when the memory region groups G11 and G12 do not need to be repaired, or generated as the second value of "1" when the memory region groups G11 and G12 need to be repaired. That is, the operation which the multi-group flag generator 240B performs on the set flag SF may be performed in the same manner as the operation which the group flag generator 240A performs on the region flag RF in FIG. 3.

Like the peripheral unit 200A of FIG. 3, the peripheral unit 200B may perform a test operation only on one memory region group according to control of the test device 10. For this operation, the peripheral unit 200B may turn off the set flag generator 230B, generate region flags only for a memory region group corresponding to the target of the test operation, and transfer the generated region flags to the multi-group flag generator 240B.

Figure 9:
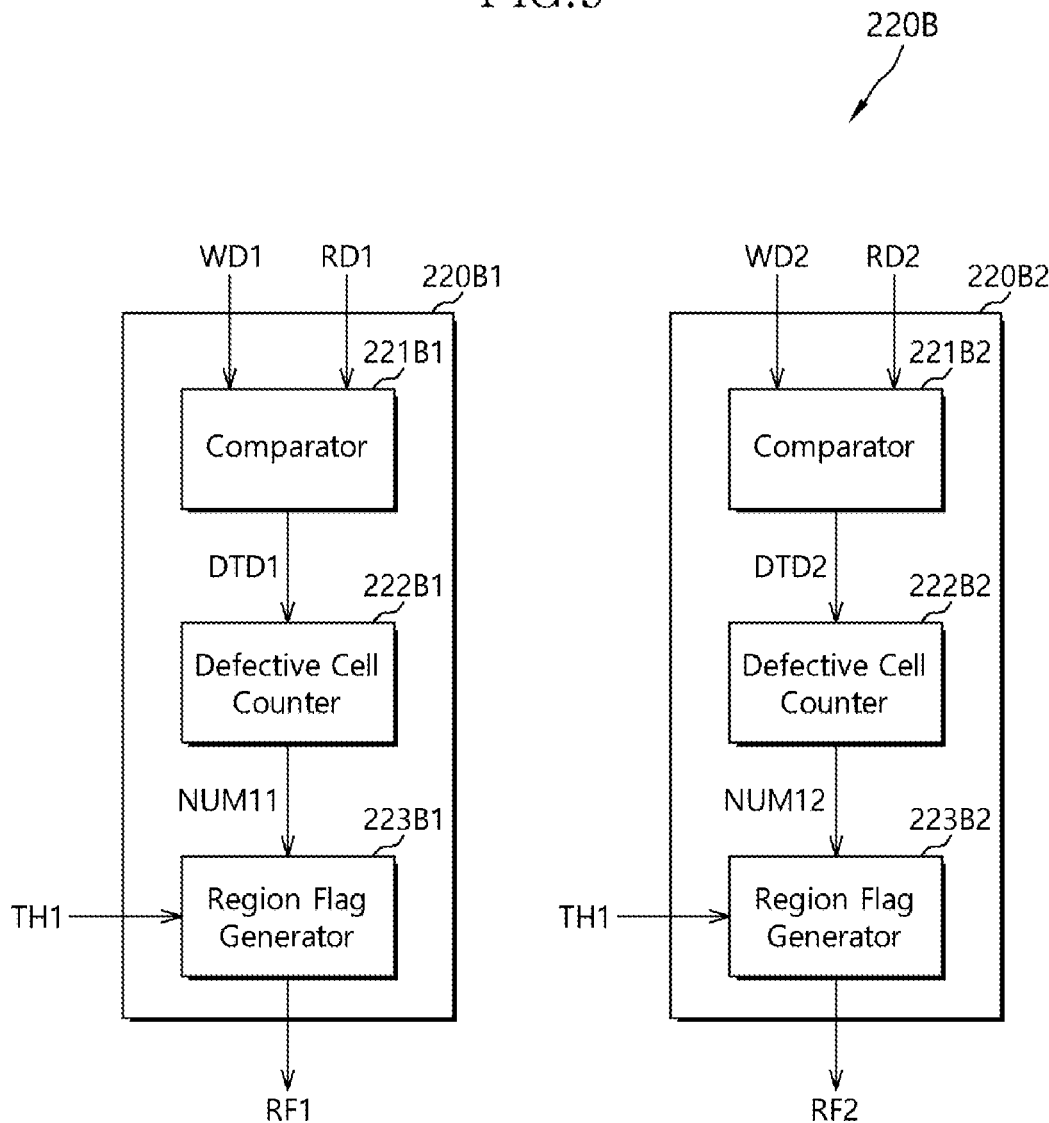
FIG. 9 is a detailed block diagram illustrating a region flag generator of FIG. 8 in accordance with the present embodiment.

FIG. 9 is a detailed block diagram illustrating the region flag generator 220B of FIG. 8 in accordance with the embodiment.

Referring to FIG. 9, the region flag generator 220B may receive the write data chunks WD1 and WD2 and the read data chunks RD1 and RD2 of the memory regions constituting each of the memory region sets S1 to S4 of FIG. 8 from the controller 210B, and output the region flags RF1 and RF2 of the memory regions to the set flag generator 230B. The read data chunks and write data chunks may be received sequentially from each memory region set, for example, write data chunks WD1 and WD2 and read data chunks RD1 and RD2 from memory region set S1 may be received, then the write and read data chunks from memory region set S2, and so on. As described above, each of the region flags RF1 and RF2 may indicate whether the corresponding memory region is a defective region or normal region.

The region flag generator 220B may include sub-region flag generators 220B1 and 220B2.

The sub-region flag generator 220B1 may receive the write data chunk WD1 and the read data chunk RD1 of the memory region included in the memory region group G11 in each of the memory region sets, and generate the region flag RF1 of the corresponding memory region.

The sub-region flag generator 220B2 may receive the write data chunk WD2 and the read data chunk RD2 of the memory region included in the memory region group G12 in each of the memory region sets, and generate the region flag RF2 of the corresponding memory region.

The sub-region flag generators 220B1 and 220B2 may be configured and operated in substantially the same manner as the region flag generator 220A of FIG. 4. Therefore, detailed descriptions of the sub-region flag generators 220B1 and 220B will be omitted.

The sub-region flag generators 220B1 and 220B2 may be operated in parallel to each other, in order to generate the region flags RF1 and RF2.

In an embodiment, when the number of memory region groups in which test operations are performed at the same time is three or more, the region flag generator 220B may include sub-region flag generators respectively corresponding to the memory region groups having test operations performed at the same time.

In an embodiment, the region flag generator 220B may be configured and operated in substantially the same manner as the region flag generator 220A of FIG. 4. In this case, the region flag generator 220B may sequentially generate the region flags RF1 and RF2 of the memory regions constituting each of the memory region sets.

Figure 10:
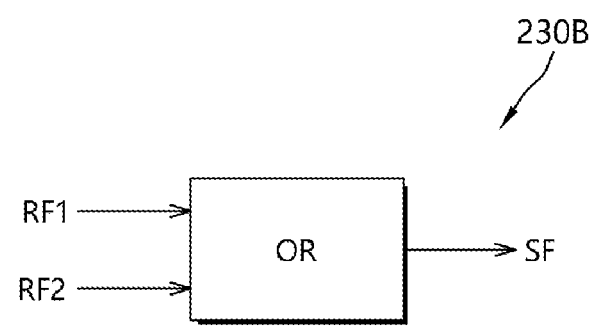
FIG. 10 is a detailed block diagram illustrating a set flag generator of FIG. 8 in accordance with the present embodiment.

FIG. 10 is a detailed block diagram illustrating the set flag generator 230B of FIG. 8 in accordance with the embodiment.

Referring to FIG. 10, the set flag generator 230B may receive the region flags RF1 and RF2 of the memory regions constituting each of the memory region sets of FIG. 8, and output the set flags SF of the respective memory region sets. As described above, the set flag SF may indicate whether one or more of the memory regions constituting the corresponding memory region set are defective regions. Hereafter, when at least one of the memory regions constituting a memory region set is a defective region, the corresponding memory region set may be defined as a defective set, and when all of the memory regions constituting a memory region set are normal regions, the corresponding memory region set may be defined as a normal set.

The set flag generator 230B may perform an OR operation on the region flags RF1 and RF2 of each memory region set, and output the set flag SF. Therefore, the set flag generator 230B may output the set flag SF as "0" when both of the region flags RF1 and RF2 of the memory region set are "0", that is, when the memory regions constituting the memory region set are all normal regions. On the other hand, the set flag generator 230B may output the set flag SF as "1" when one or more of the region flags RF1 and RF2 of the memory region set are "1", that is, when the memory region set is a defective set.

Figure 11:
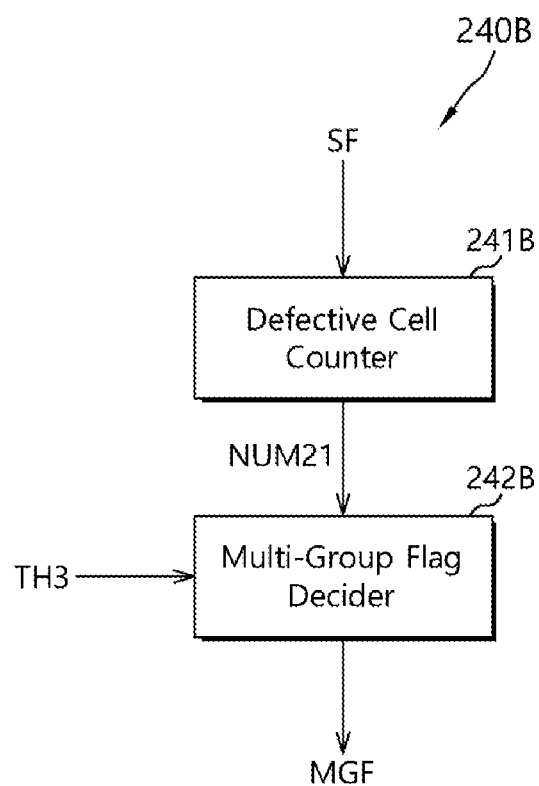
FIG. 11 is a detailed block diagram illustrating a multi-group flag generator of FIG. 8 in accordance with the present embodiment.

FIG. 11 is a detailed block diagram illustrating the multi-group flag generator 240B of FIG. 8 in accordance with the embodiment.

Referring to FIG. 11, the multi-group flag generator 240B may receive the set flags SF of the memory region sets S1 to S4 of the memory region groups G11 and G12 in FIG. 8, and output the mufti-group flag MGF of the memory region groups G11 and G12. As described above, the multi-group flag MGF may indicate whether the memory region groups G11 and G12 need to be repaired.

The multi-group flag MGF may be determined according to the number of defective sets included in the memory region groups G11 and G12. The multi-group flag generator 240B may determine whether the memory region groups G11 and G12 include a larger number of defective sets than an allowable number in consideration of the error correction function of the memory chip, based on the set flags SF of the memory sets included in the memory region groups G11 and G12, and output the multi-group flag MGF of the memory region groups G11 and G12 according to the determination result. Although the memory region groups G11 and G12 include one or more defective sets, the memory region groups G11 and G12 may be determined to be normal region groups in the case where the number of defective sets included therein is allowable.

The multi-group flag generator 240B may include a defective set counter 241B and a multi-group flag decider 242B.

The defective set counter 241B may receive the set flags SF of the respective memory region sets included in the memory region groups G11 and G12 of FIG. 8, and output a defective set number NUM21 of the memory region groups G11 and G12. The defective set number NUM21 may indicate the number of defective sets among the memory region sets S1 to S4 of the memory region groups G11 and G12.

In an embodiment, a count of the defective set counter 241B may be reset to zero. Subsequently, the defective set counter 241B may sequentially receive the set flags of the memory region sets S1 to S4 of the memory region groups G11 and G12. The defective set counter 241B may increase the count when each of the received set flags SF has the second value of "1", and not increase the count otherwise. The defective set counter 241B may receive the set flag SF of the last memory region set S4 of the memory region groups G11 and G12, perform counting depending on the set flag SF, and output the count result as the defective set number NUM21.

In an embodiment, the defective set counter 241B may receive a timing signal (not illustrated) from the controller 210B whenever the set flag SF of each of the memory region sets is received. The defective set counter 241B may determine that the received set flag SF has the second value, in response to the timing signal, and perform counting depending on the determination result.

The multi-group flag decider 242B may receive the defective set number NUM21 of the memory region groups G11 and G12 from the defective set counter 241B, and output the multi-group flag MGF of the memory region groups G11 and G12. The multi-group flag decider 242B may generate the multi-group flag MGF by comparing the defective set number NUM21 to the third reference number TH3 transferred from the controller 210B. The third reference number TH3 may indicate the number of defective sets which can be allowed in the memory region groups G11 and G12.

Therefore, when the defective set number NUM21 of the memory region groups G11 and G12 is equal to or less than the third reference number TH3, the multi-group flag decider 242B may determine that the memory region groups G11 and G12 are normal groups. The normal region group may indicate a memory region group which does not need to be repaired. In this case, the multi-group flag decider 242B may generate the multi-group flag MGF as the first value of "0".

On the other hand, when the defective set number NUM21 of the memory region groups G11 and G12 exceeds the third reference number TH3, the multi-group flag decider 242B may determine that the memory region groups G11 and G12 are defective region groups. The defective region group may indicate a memory region group which needs to be repaired. In this case, the multi-group flag decider 242B may generate the multi-group flag MGF as the second value of "1".

In an embodiment, the third reference number TH3 may be stored in a memory element included in the multi-group flag decider 242B after the test operation is started, and the stored third reference number TH3 compared to the defective set number NUM21 whenever the defective set number NUM21 is inputted to the multi-group flag decider 242B.

The third reference number TH3 may be equal to or different from the second reference number TH2 of FIG. 3.

FIGS. 12A to 12E illustrate the process by which the peripheral unit 200B of FIG. 9 performs a test operation on the memory region groups G11 and G12 in accordance with the embodiment. In FIGS. 12A to 12E, the peripheral unit 200B may generate the multi-group flag MGF of the memory region groups G11 and G12 by sequentially performing steps S21 to S25 according to control of the test device 10 of FIG. 1. Hereafter, the process for performing a test operation will be described in detail with reference to FIGS. 8 to 12E.

Figure 12A:
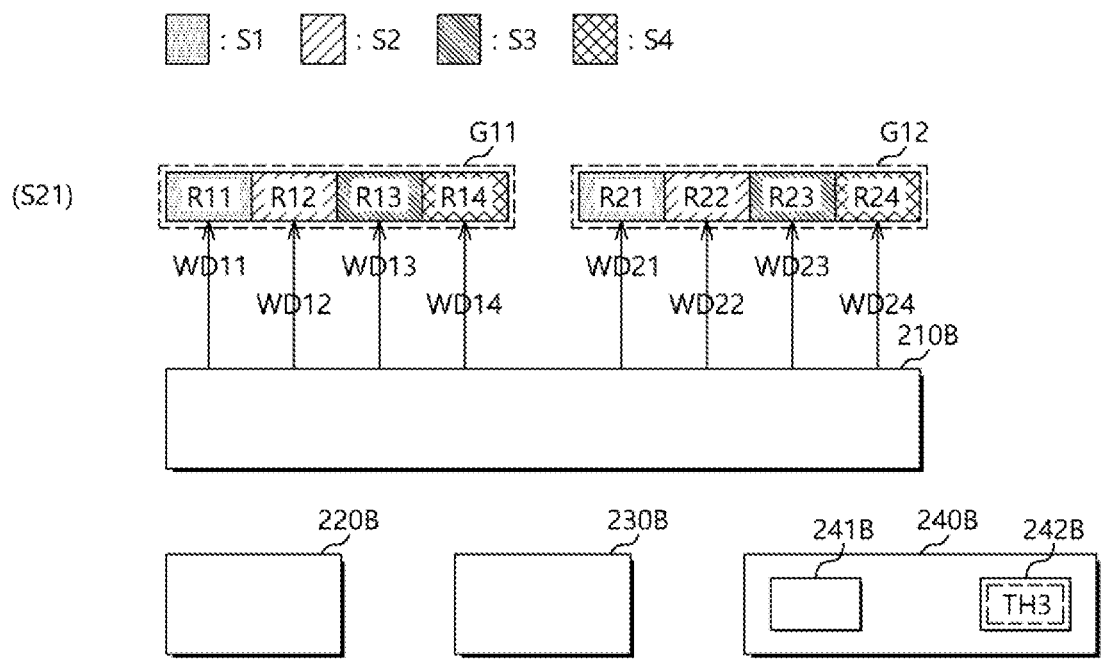
FIGS. 12A, 12B, 12C, 12D, and 12E illustrate respective steps of a process by which the peripheral unit of FIG. 8 performs a test operation on memory region groups in accordance with the present embodiment.

Referring to FIG. 12A, the controller 210B may write the write data chunks WD11 to WD14 and WD21 to WD24 to the memory regions R11 to R14 and R21 to R24 of the memory region groups G11 and G12, respectively, at step S21. In an embodiment, the controller 210B may not write the write data chunks WD11 to WD14 and WD21 to WD24 to the memory regions R11 to R14 and R21 to R24 at the same time, but writes the write data chunks corresponding to the respective memory region sets to the memory regions before reading read data chunks from the respective memory region sets at steps S22 to S25. In an embodiment, at step S21 a count of the defective set counter 241B of the multi-group flag generator 240B is reset.

Figure 12B:
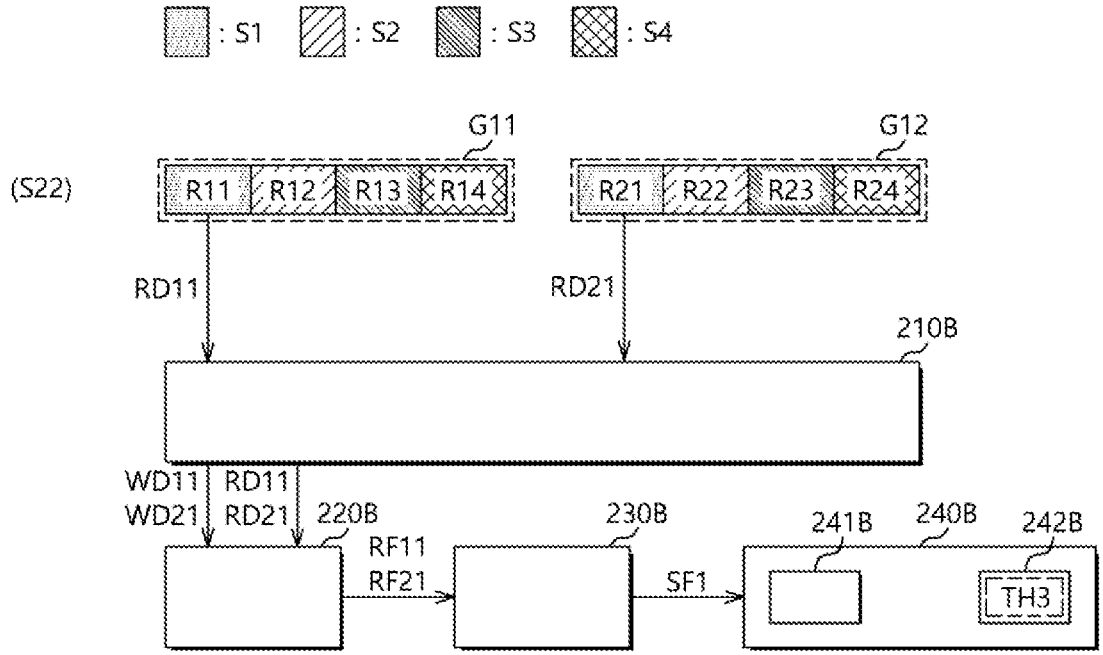

Referring to FIG. 12B, the controller 210B may read the read data chunks RD11 and RD21 from the memory regions R11 and R21 constituting the memory region set S1 at step S22. The controller 210B may transfer the write data chunks WD11 and WD21 written to the memory regions R11 and R21 and the read data chunks RD11 and RD21 to the region flag generator 220B.

The region flag generator 220B may generate the region flags RF11 and RF21 of the memory regions R11 and R21 based on the write data chunks WD11 and WD21 and the read data chunks RD11 and RD21, and transfer the region flags RF11 and RF21 to the set flag generator 230B.

The set flag generator 230B may generate the set flag SF1 of the memory region set S1 based on the region flags RF11 and RF21 of the memory regions R11 and R21, and transfer the generated set flag SF1 to the multi-group flag generator 240B.

The defective set counter 241B of the multi-group flag generator 240B may increase the count when the memory region set S1 is determined to be a defective set according to the set flag SF1 of the memory region set S1.

Figure 12C:
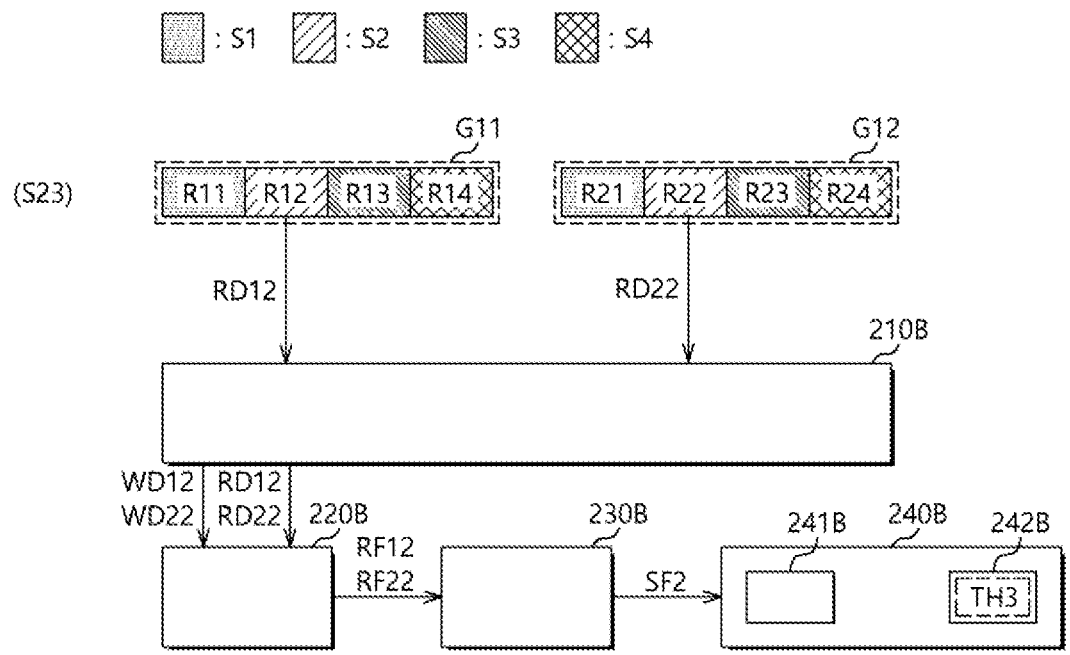
Figure 12D:
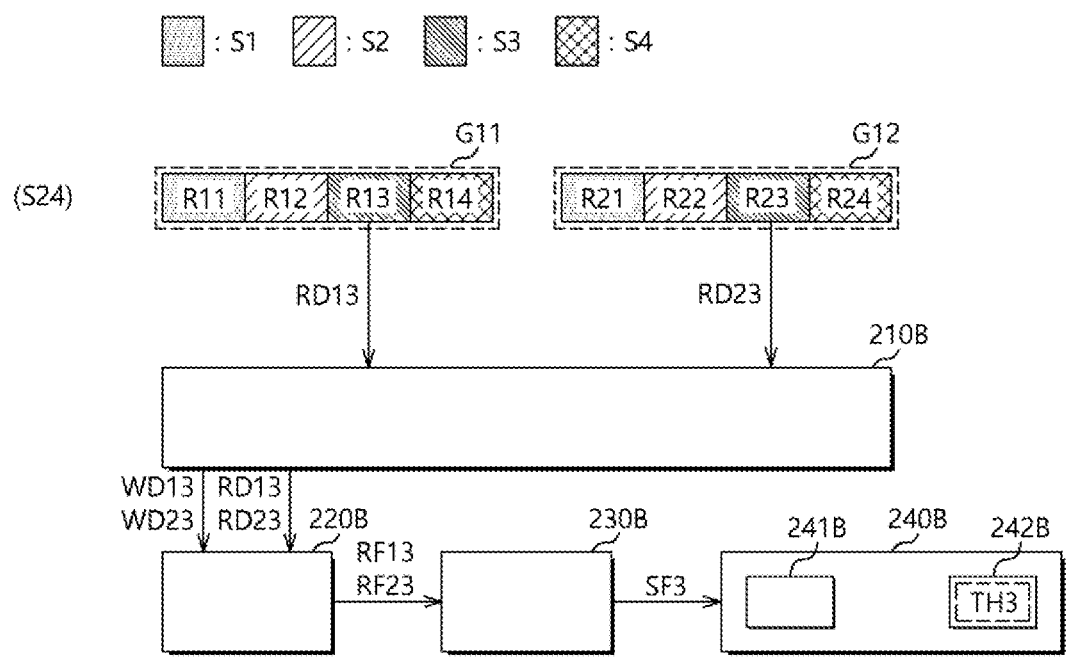
Figure 12E:
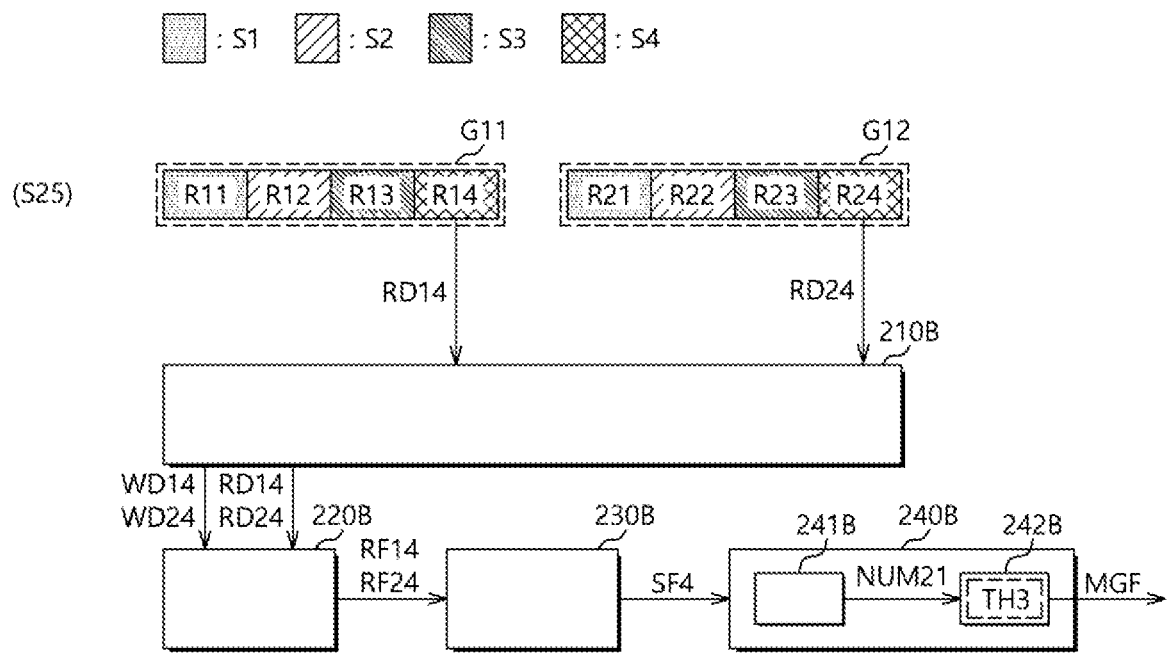

Referring to FIGS. 12C to 12E, the controller 210B, the region flag generator 220B and the set flag generator 230B may sequentially generate the set flags SF2 to SF4 of the memory region sets S2 to S4 in a similar manner to the generating of the set flag SF1 of the memory region set S1 at step S22, and transfer the set flags SF2 to SF4 to the defective set counter 241B, at steps S23 to S25. The defective set counter 241B may increase the count whenever each of the memory region sets S2 to S4 is determined to be a defective set, according to the set flags SF2 to SF4.

At step S25, the defective set counter 241B may output the final count result, i.e. the defective set number NUM21 to the multi-group flag decider 242B. The multi-group flag decider 242B may output the multi-group flag MGF by comparing the defective set number NUM21 to the third reference number TH3.

Figure 13:
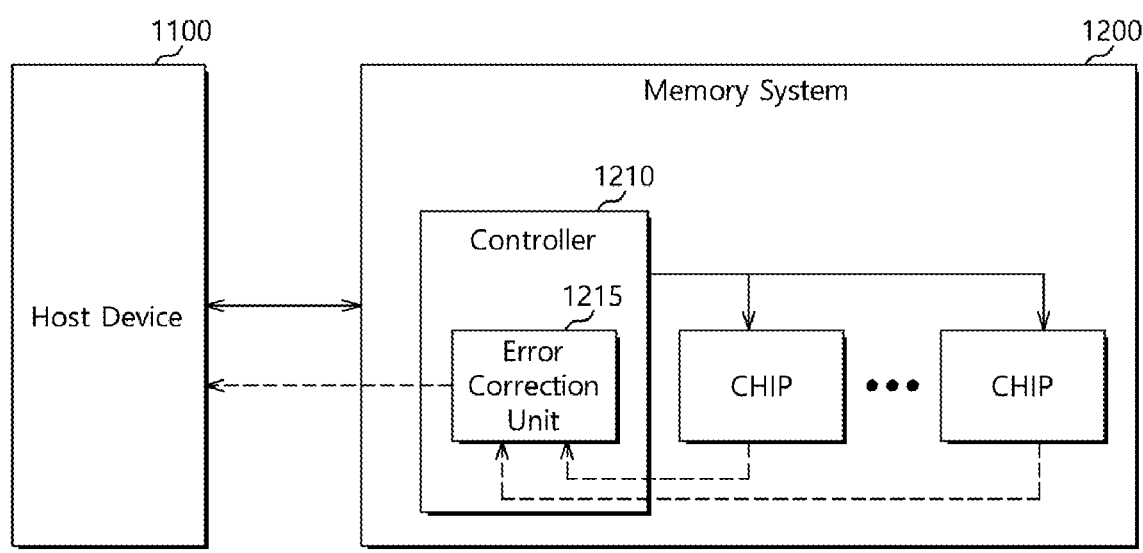
FIG. 13 is a block diagram illustrating a data processing system including a memory system in accordance with an embodiment.

FIG. 13 is a diagram illustrating a data processing system 1000 including a memory system 1200 in accordance with an embodiment.

Referring to FIG. 13, the data processing system 1000 may include a host device 1100 and a memory system 1200.

The data processing system 1000, which is an electronic system capable of processing data, may include a data center, Internet data center, personal computer, laptop computer, smart phone, tablet computer, digital camera, game console, navigation system, virtual-reality device, wearable device and the like.

The host device 1100 may control the memory system 1200, and store data in the memory system 1200.

The memory system 1200 may include a controller 1210 and memory chips CHIP.

The controller 1210 may store data transferred from the host device 1100 into the memory chips CHIP according to control of the host device 1100, or read data from the memory chips CHIP and output the read data to the host device 1100.

The controller 1210 may include an error correction unit 1215. The error correction unit 1215 may perform an error correction operation on the data read from the memory chips CHIP, based on a predetermined error correction code. The controller 1210 may provide the data corrected by the error correction unit 1215 to the host device 1100.

Each of the memory chips CHIP may include a memory chip which is packaged into the memory system 1200 after defective memory region groups have been repaired through a test operation in the test system 1 of FIG. 1.

Each of the memory chips CHIP may include a memory region group which is not repaired, because the memory region group includes an allowable number of defective cells in consideration of the error correction ability of the error correction unit 1215. Errors of data read from the corresponding memory region group may be corrected by the error correction unit 1215.

FIG. 13 illustrates that the error correction unit is present outside the memory chips. However, each of the memory chips may also include an error correction unit therein. In this case, the memory chip may be allowed to include an allowable number of defects. Therefore, the yield of the memory chips can be improved.

In accordance with the present embodiments, the memory chip and the test system including the same can perform a test operation in consideration of the error correction ability, thereby increasing the yield.

Furthermore, the memory chip and the test system including the same can shorten the performance time of the test operation.

While various embodiments have been described above, it will be understood to those skilled in the art that the embodiments described are examples only. Accordingly, the operating method of a data storage device described herein should not be limited based on the described embodiments.

What is claimed is:

1. A memory chip comprising:
a memory region group comprising a plurality of memory regions, each of the memory regions comprising a plurality of memory cells; and
a peripheral unit configured to:
generate region flags of the memory regions based on defective cell numbers of the memory regions and a first reference number, each of the defective cell numbers indicating a number of defective cells in a corresponding memory region, each of the region flags indicating whether a corresponding memory region is a defective region,
determine a defective region number based on the region flags, the defective region number indicating a number of defective regions among the memory regions, and
generate a group flag based on the defective region number and a second reference number, the group flag indicating whether the memory region group needs to be repaired.

2. The memory chip according to claim 1, wherein the peripheral unit determines a defective cell number of a memory region by comparing a write data chunk and a read data chunk of the memory region, and determines a region flag of the memory region by comparing the defective cell number to the first reference number,
wherein the first reference number indicates an allowable number of defective cells associated with the memory chip.

3. The memory chip according to claim 2, wherein when a write bit and a read bit of a memory cell included in the memory region are different from each other, the peripheral unit determines that the memory cell is a defective cell.

4. The memory chip according to claim 2, wherein the peripheral unit determines the region flag by determining that the memory region is a normal region when the defective cell number is equal to or less than the first reference number, and determining that the memory region is the defective region when the defective cell number exceeds the first reference number.

5. The memory chip according to claim 2, wherein the peripheral unit writes the write data chunk to the memory region and reads the read data chunk from the memory region.

6. The memory chip according to claim 1, wherein the peripheral unit determines the group flag by comparing the defective region number to the second reference number,
   wherein the second reference number indicates an allowable number of defective regions associated with the memory chip.

7. The memory chip according to claim 6, wherein the peripheral unit determines the group flag by determining that the memory region group is a normal region group when the defective region number is equal to or less than the second reference number, and determining that the memory region group is a defective region group when the defective region number exceeds the second reference number.

8. A memory chip comprising:
   a plurality of memory region groups each comprising a plurality of memory regions, each of the memory regions comprising a plurality of memory cells, the memory region groups including a plurality of memory region sets, each memory region set being grouped with memory regions that are configured to be accessible at the same time; and
   a peripheral unit configured to:
      generate set flags of the memory region sets, each of the set flags indicating whether a corresponding memory region set is a defective set having at least one of defective region of memory regions of the corresponding memory region set,
      determine a defective set number based on the set flags, the defective set number indicating a number of defective sets among the memory region sets, and
      generate a multi-group flag based on the defective set number and a reference number, the multi-group flag indicating whether all of the memory region groups need to be repaired.

9. The memory chip according to claim 8, wherein the peripheral unit generates region flags of memory regions of a memory region set by accessing the memory regions of memory region set at the same time, and generates a set flag of the memory region set based on the region flags,
   wherein each of the region flags indicates whether a corresponding memory region is a defective region.

10. The memory chip according to claim 9, wherein when at least one of the memory regions of the memory region set is determined to be the defective region based on the region flags, the peripheral unit determines the set flag by determining that the memory region set is the defective set.

11. The memory chip according to claim 9, wherein the peripheral unit determines a defective cell number indicating a number of defective cells of a memory region by comparing a write data chunk and a read data chunk of the memory region, and determines a region flag of the memory region by comparing the defective cell number to a first reference number,
   wherein the first reference number indicates an allowable number of defective cells associated with the memory chip.

12. The memory chip according to claim 11, wherein when a write bit and a read bit of a memory cell included in the memory region are different from each other, the peripheral unit determines that the memory cell is a defective cell.

13. The memory chip according to claim 11, wherein the peripheral unit determines the region flag by determining that the memory region is a normal region when the defective cell number is equal to or less than the first reference number, and determining that the memory region is the defective region when the defective cell number exceeds the first reference number.

14. The memory chip according to claim 11, wherein the peripheral unit writes the write data chunk to the memory region, and then reads the read data chunk from the memory region.

15. The memory chip according to claim 8, wherein the peripheral unit determines the multi-group flag by comparing the defective set number to a reference number,
   wherein the reference number indicates an allowable number of defective sets associated with the memory chip.

16. The memory chip according to claim 15, wherein the peripheral unit determines the multi-group flag by determining that the memory region groups are normal region groups when the defective set number is equal to or less than the reference number, and determining that the memory region groups are defective region groups when the defective set number exceeds the reference number.

17. The memory chip according to claim 8, further comprising repair regions corresponding to the respective memory region groups,
   wherein the repair regions comprise repair memory region groups, respectively, and
   the memory region groups are replaced with the repair memory region groups based on the multi-group flag.

18. A test system comprising:
   a memory chip comprising:
   a memory region group comprising a plurality of memory regions, each of the memory regions comprising a plurality of memory cells;
   a peripheral unit configured to:
      generate region flags of the memory regions based on defective cell numbers of the memory regions and a first reference number, each of the defective cell numbers indicating a number of defective cells in a corresponding memory region, and each of the region flags indicating whether the corresponding memory region is a defective region,
      determine a defective region number based on the region flags, the defective region number indicating a number of defective regions among the memory regions, and
      generate a group flag based on the defective region number and a second reference number; and
   a test device configured to control the memory chip, and repair the memory region group according to the group flag.

19. A test system comprising:
   a memory chip comprising:
      a plurality of memory region groups each comprising a plurality of memory regions, each of the memory regions comprising a plurality of memory cells, wherein memory regions which are accessible at the same time in the memory region groups are grouped as a memory region set, such that the memory region groups comprise a plurality of memory region sets; and
      a peripheral unit configured to:
         generate set flags of the memory region sets, each of the set flags indicating whether a corresponding memory region set is a defective set having at least one of defective region of memory regions of the corresponding memory region set,
         determine a defective set number based on the set flags, the defective set number indicating a number of defective sets among the memory region sets, and generate a multi-group flag based on the defective set number and a reference number, the multi-group flag indicating whether all of the memory region groups need to be repaired; and a test device configured to control the memory chip, and repair the memory region groups according to the multi-group flag.

\* \* \* \* \*